United States Patent
Zhao et al.

(10) Patent No.: US 10,962,682 B2
(45) Date of Patent: Mar. 30, 2021

(54) SYSTEM AND METHOD FOR FORECASTING FLOODS

(71) Applicant: Wuhan University, Wuhan (CN)

(72) Inventors: Yan Zhao, Wuhan (CN); Pan Liu, Wuhan (CN); Chao Deng, Wuhan (CN)

(73) Assignee: WUHAN UNIVERSITY, Wuhan (CN)

(*) Notice: Subject to any disclaimer, the term of this patent is extended or adjusted under 35 U.S.C. 154(b) by 93 days.

(21) Appl. No.: 16/371,154

(22) Filed: Apr. 1, 2019

(65) Prior Publication Data

US 2019/0227194 A1    Jul. 25, 2019

Related U.S. Application Data

(63) Continuation-in-part of application No. 15/377,974, filed on Dec. 13, 2016, now abandoned.

(30) Foreign Application Priority Data

Dec. 15, 2015  (CN) .......................... 201510932746.0

(51) Int. Cl.
*G01W 1/10* (2006.01)
*G06F 17/10* (2006.01)
*G01S 13/95* (2006.01)

(52) U.S. Cl.
CPC ............. *G01W 1/10* (2013.01); *G01S 13/958* (2013.01); *G06F 17/10* (2013.01)

(58) Field of Classification Search
CPC ........ G01W 1/10; G06F 17/10; G01S 13/958; Y02A 10/40; Y02A 90/10
See application file for complete search history.

(56) References Cited

U.S. PATENT DOCUMENTS

2012/0264393 A1* 10/2012 Pinhanez ................ H04L 67/12
455/404.1

* cited by examiner

*Primary Examiner* — Saif A Alhija
(74) *Attorney, Agent, or Firm* — JCIP Global Inc.

(57) ABSTRACT

A method for forecasting flood, the method including: calibrating the hydrological model by using an objective function that is a sum of squared difference between the observed streamflow and the corresponding forecasted streamflow at each lead time to obtain the optimized hydrological model; using the optimized hydrological model to forecast floods; and evaluating forecasting performance of the optimized hydrological model. The method improves the forecasting accuracy and provides forecasting results at various lead times.

1 Claim, 4 Drawing Sheets

SYSTEM AND METHOD FOR FORECASTING FLOODS

CROSS-REFERENCE TO RELATED APPLICATIONS

This application is a continuation-in-part of and claims domestic priority to U.S. patent application Ser. No. 15/377,974, filed Dec. 13, 2016, now pending, which under 35 U.S.C. § 119 and the Paris Convention Treaty claims foreign priority benefit to Chinese Patent Application No. 201510932746.0 filed Dec. 15, 2015. The contents of all of the aforementioned applications, including any intervening amendments thereto, are incorporated herein by reference. Inquiries from the public to applicants or assignees concerning this document or the related applications should be directed to: Matthias Scholl P C., Attn.: Dr. Matthias Scholl Esq., 245 First Street, 18th Floor, Cambridge, Mass. 02142.

BACKGROUND OF THE INVENTION

Field of the Invention

The invention relates to a system and method for forecasting floods at multiple lead times.

Description of the Related Art

A conventional method for flood forecasting is as follows: 1) collecting historical hydrological data with gauges for a basin, 2) establishing a hydrological model, 3) implementing parameters calibration with respect to the hydrological model with a determined objective function, 4) sending the forecasts to the manager computing devices, and 5) evaluating the performance of the hydrological model using forecasting evaluation criteria.

In general, a conventional method uses real-time observed or weather predicted rain fall data. The lead time of forecast is relatively short due to the poor timeliness of the observed rainfall collected from gauges, or the forecasting accuracy is relatively low due to the uncertainty of weather-predicted rainfall.

In addition, the conventional methods are aimed at hydrological simulation rather than forecasting; thus, the objective functions are built to reflect the rain-runoff relationship, which have little forecasting ability.

In addition, evaluation criteria in the conventional methods only focus on forecasted result at a single lead time and is unable to simultaneously describe the forecasted results at multiple lead times.

SUMMARY OF THE INVENTION

In view of the above-described problems, it is one objective of the invention to provide a method and a system for forecasting floods at multiple lead times.

To achieve the above objective, in accordance with one embodiment of the invention, there is provided a method for forecasting flood at multiple lead times. The method comprises:

1) obtaining hydrological variables comprising precipitation and evaporation for a basin, in which the precipitation is obtained by measuring rainfall data with radars, rain gauges, and precipitation micro-physical characteristics sensors (PMCSs) and by combining the rainfall data from the radars, the rain gauges, and the PMCSs;

2) collecting historical flood information for the basin to estimate a mean concentration time of the basin and to determine a maximum lead time k;

3) obtaining a series of observed streamflow $Q_t^{obs}$ from a hydrologic station at the outlet of the basin, in which the observed streamflow $Q_t^{obs}$ represents the observed streamflow at a time t; t is an integer, and $1 \le t \le N$; and N is a total number of observations;

4) establishing a hydrological model, and using the hydrological model for prediction by inputting the hydrological variables to the hydrological model to obtain a series of forecasted streamflow $Q_{t,t-j}^{pre}$; in which the forecasted streamflow $Q_{t,t-j}^{pre}$ represents the forecasted streamflow at the time t at a lead time j; j is an integer, and $1 \le j \le k$; and the precipitation within lead times are neglected for the prediction;

5) calibrating parameters of the hydrological model with an objective function as follows to obtain the optimized hydrological model:

$$\min F = \sum_{t=1}^{N} \left( (Q_t^{obs} - Q_{t,t-1}^{pre})^2 + (Q_t^{obs} - Q_{t,t-2}^{pre})^2 + \ldots + (Q_t^{obs} - Q_{t,t-k}^{pre})^2 \right);$$

6) using the optimized hydrological model for prediction to obtain results for flood forecasts at multiple lead times, and sending the results for flood forecasts at the multiple lead times to a manager computing device for flood prevention; and 7) evaluating the forecasting performance of the optimized hydrological model by using a criterion selected from: a Nash-Sutcliffe efficiency, a root mean square error, a water balance index, a qualified rate of peak flow, and a qualified rate of a peak time.

Advantages of the method for forecasting flood in the invention are summarized as follows:

1. The predicted rainfall results obtained by using the method of the invention are more reliable than that obtained by using conventional methods.
2. The objective function for calibrating the hydrological model, is a sum of squared difference between the observed streamflow at each time and the forecasted stream flow at the corresponding time at every lead time that is not longer than the maximum lead time. The objective function allows for joint optimization of the forecasting capabilities of the hydrological model at multiple lead times to achieve an optimized hydrological model.
3. The optimized hydrological model obtained from the method of the invention has enhanced forecasting accuracy. In addition, the optimized hydrological model provides forecasted results at multiple lead times, and thus allows for providing early warning of flood events and improving flood prevention.
4. The method of the invention allows for lengthening the maximum lead time for flood forecasting.

DETAILED DESCRIPTION OF THE EMBODIMENTS

For further illustrating the invention, examples detailing the method and system for flood forecasting are further set forth below. It should be noted that the following examples are intended to describe and not to limit the invention.

Figure 1:
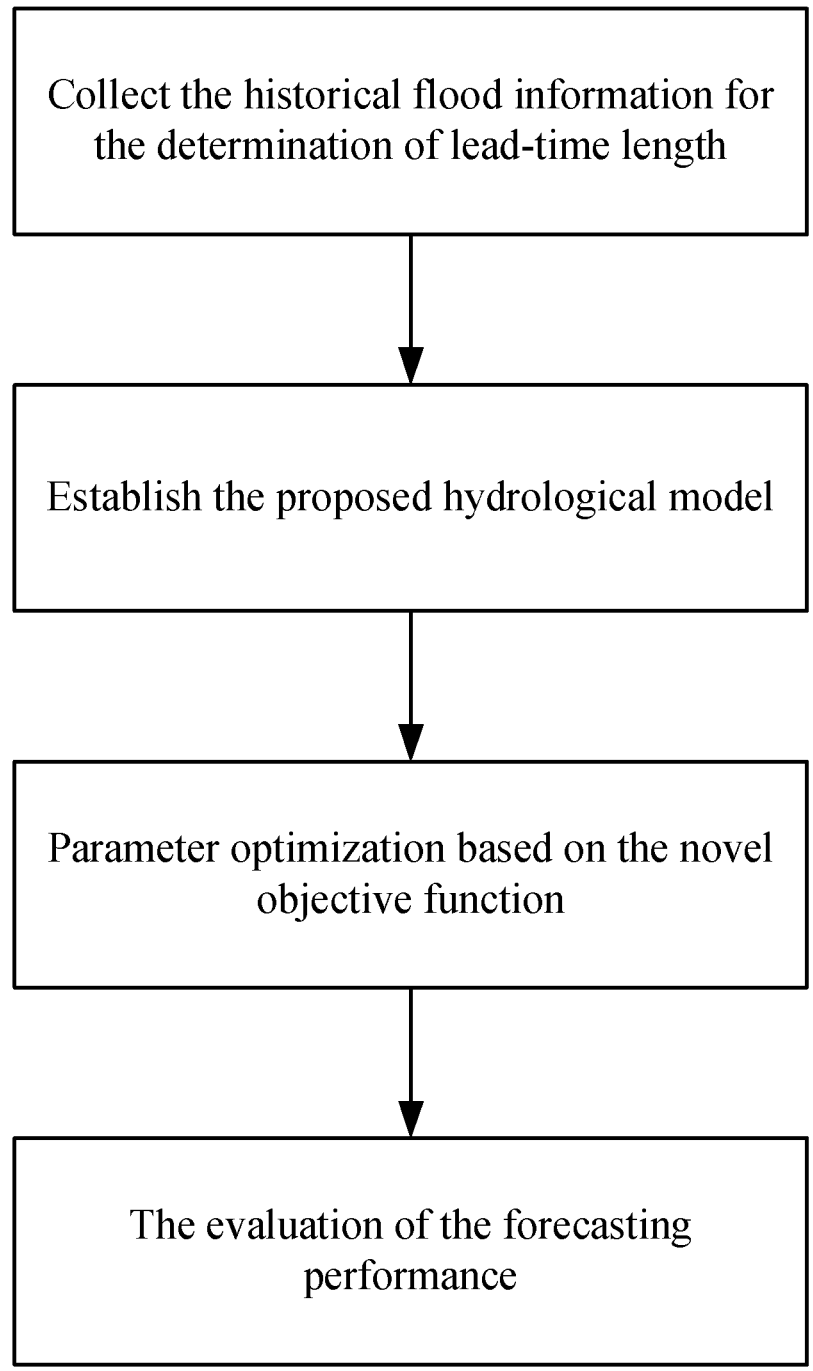
FIG. 1 is a flow chart of the method for forecasting flood at multiple lead times according to one embodiment of the invention.

As shown in FIG. 1, the method for forecasting flood at multiple lead times is as follows:

obtaining hydrological variables comprising precipitation and evaporation for a basin, in which rainfall data is measured with radar, rain gauges, and the precipitation microphysical characteristics sensor (PMCS), and the rainfall data from the three sources are combined to calculate the precipitation;

collecting historical flood information to estimate the average time of concentration for the basin so as to determine the length of lead time (i.e., the maximum lead time k for flood forecasting);

establishing a proposed hydrological model and using the proposed hydrological model for prediction to obtain the forecasted streamflow by inputting the hydrological variables (i.e. precipitation and evaporation) to the hydrological model;

calibrating the hydrological model to obtain the optimized parameters for the model so as to result in the optimized hydrological model by using the following objective function, which is sum of the squared difference between the observed streamflow at each time and the forecasted streamflow at the corresponding time at every lead time within the maximum lead time k;

$$\min F = \sum_{t=1}^{N} \left( (Q_t^{obs} - Q_{t,t-1}^{pre})^2 + (Q_t^{obs} - Q_{t,t-2}^{pre})^2 + \ldots + (Q_t^{obs} - Q_{t,t-k}^{pre})^2 \right); \quad (1)$$

in the model calibration, $Q^{obs}$ is the observed streamflow at time t (t=1, 2, ..., N), N is the total number of the observed streamflow; $Q_{t,t-j}^{pre}$ is the forecasted streamflow at time t at a lead time j, which is based on the inputs for forecasting at time j ahead of time t;

using the optimized hydrological model to obtain forecasted results and sending the forecasted results to devices of managers for flood prevention; and validating the optimized hydrological model to evaluate the forecasting performance of the model by using a widely used criterion selected from: the Nash-Sutcliffe efficiency (NSE), Root Mean Square Error (RMSE), Water balance index (WBI), the qualified rate of peak flow (QRF) and the qualified rate of peak time (QRT).

In the method, the parameters of the model are calibrated not only by using a single optimized algorithm but also by various combined algorithms. For example, the estimated parameters of Genetic algorithm can be treated as the initial values of the Rosen Brock methods, as well as the estimates of Rosen Brock methods can treated as the initial values of Simplex method.

The formulas for the model validation are as follows:

$$NSE = 1 - \frac{\sum_{t=1}^{N} (Q_t^{pre} - Q_t^{obs})^2}{\sum_{t=1}^{N} (Q_t^{obs} - \overline{Q_{obs}})^2}; \quad (2)$$

$$RMSE = \sqrt{\frac{\sum_{t=1}^{N} (Q_t^{pre} - Q_t^{obs})^2}{N}}; \quad (3)$$

$$QRF = \frac{NF}{M}; \quad (4)$$

$$QRT = \frac{NT}{M}; \quad (5)$$

in which, $Q^{pre}$ is the predicted streamflow at time t; $Q_{obs}$ is the mean value of the observed streamflow; $W_{pre}$ and $W_{obs}$ are the total volume of the predicted and observed flow, respectively; NF is the number of the qualified flood events about peak flow; NT is the number of the qualified flood events about peak time; M is the total flood events.

Example

The method of the invention is implemented with respect to Xunhe river basin which is located at the Shanxi province. The basin has a drainage area of 6448 km2, a length of the river of approximately 218 km, and the average annual flow of about 73 m³/s. The basin has a subtropical monsoon climate which is wet and moderate with an annual average temperature of 15-17° C. The rainfall across the basin in summer is abundant, which accounts for a large proportion (70%-80%) of the yearly rainfall.

In the method, 28 rainfall stations and 3 hydrologic gauged stations are spreading over the basin for data collection. The areal precipitation is collected by applying the Thiessen polygon method to the gauge data of the rainfall stations, and the areal pan evaporation is computed by using the average value of the data from gauged stations. Discharge is measured at the outlet of the basin. Across the period 1991-2001, data of 1991 is used for warm-up. Data during 1992-1996 and 1997-2001 are served for calibration and validation, respectively.

The invented method and the conventional method are both used for the flood forecasting at lead times of 1-3 days. The NSE, RMSE and WBI are used as the evaluation indicators for model validation.

TABLE 1

Evaluation of flood forecasting performance of the conventional and invented methods

| | Lead time (day) | Calibration period | | | Validation period | | |
|---|---|---|---|---|---|---|---|
| | | NSE | WBI | RMSE | NSE | WBI | RMSE |
| Invented method | 1 | 0.90 | 1.14 | 61.24 | 0.79 | 1.17 | 62.36 |
| | 2 | 0.62 | 0.90 | 119.09 | 0.57 | 0.94 | 90.16 |
| | 3 | 0.33 | 0.70 | 157.82 | 0.24 | 0.75 | 120.42 |
| Conventional method | 1 | 0.94 | 0.96 | 46.36 | 0.88 | 0.94 | 47.66 |
| | 2 | 0.51 | 0.69 | 135.50 | 0.43 | 0.71 | 103.71 |
| | 3 | 0.23 | 0.56 | 169.49 | 0.14 | 0.60 | 127.39 |

The performances of conventional and invented methods are summarized in Table 1 as above. As shown in Table 1, the forecasting accuracy of both methods decreases with the increased lead time. In both the calibration period and the validation period, the NSE in the invented method is smaller than that in the conventional method for 1-day lead time, but the NSE in the invented method is larger than that in the conventional system for both 2-day and 3-day lead times. Similarly, the invented method has significant improvements in terms of WBI and RMSE as compared to the conventional method for the 2-day and 3-day lead times.

Figure 2:
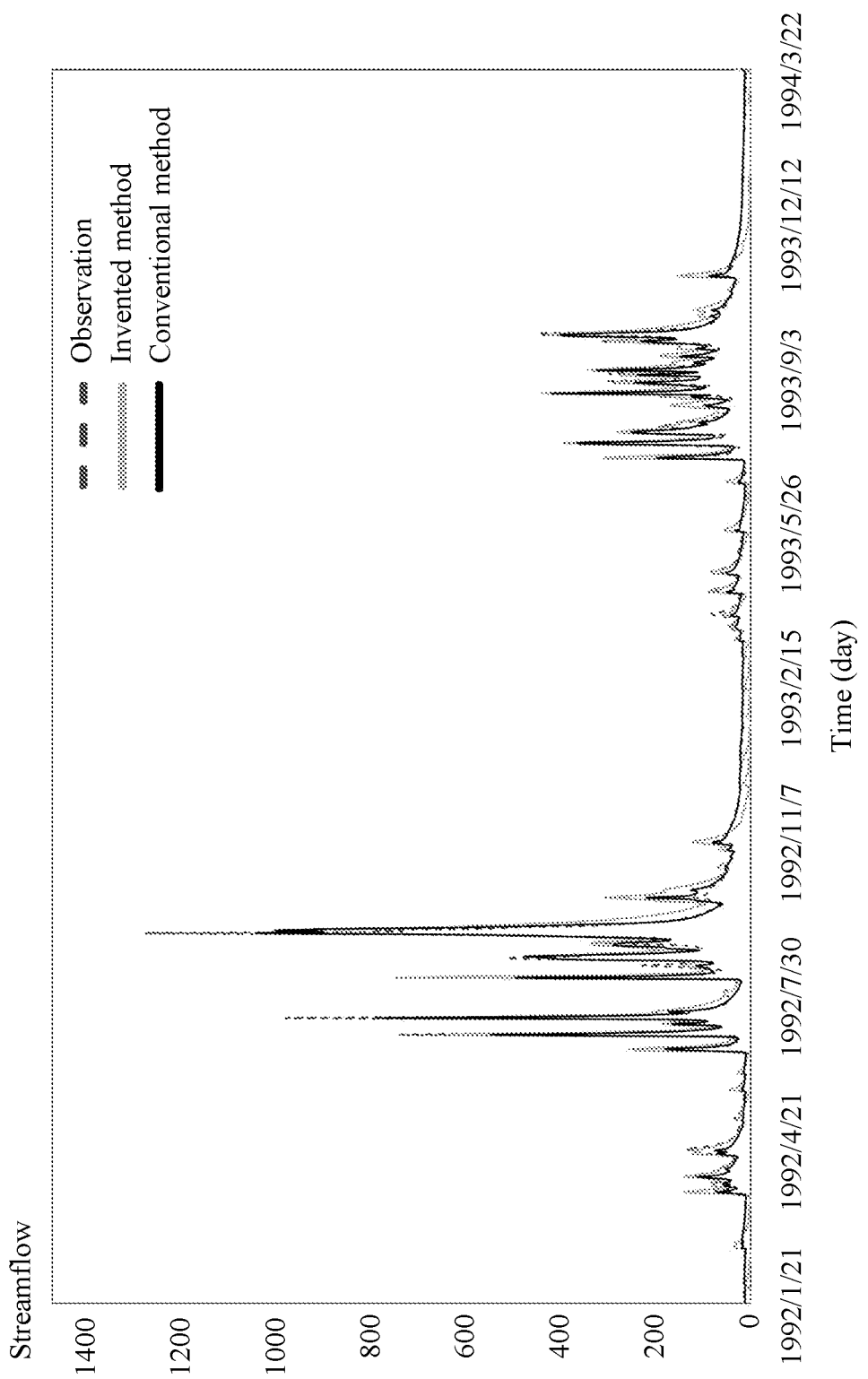
FIG. 2 is a schematic diagram of comparison between the observed results, the forecasting results of the invented method at 1-day lead time, and the forecasting results of the conventional method at 1-day lead time.
Figure 3:
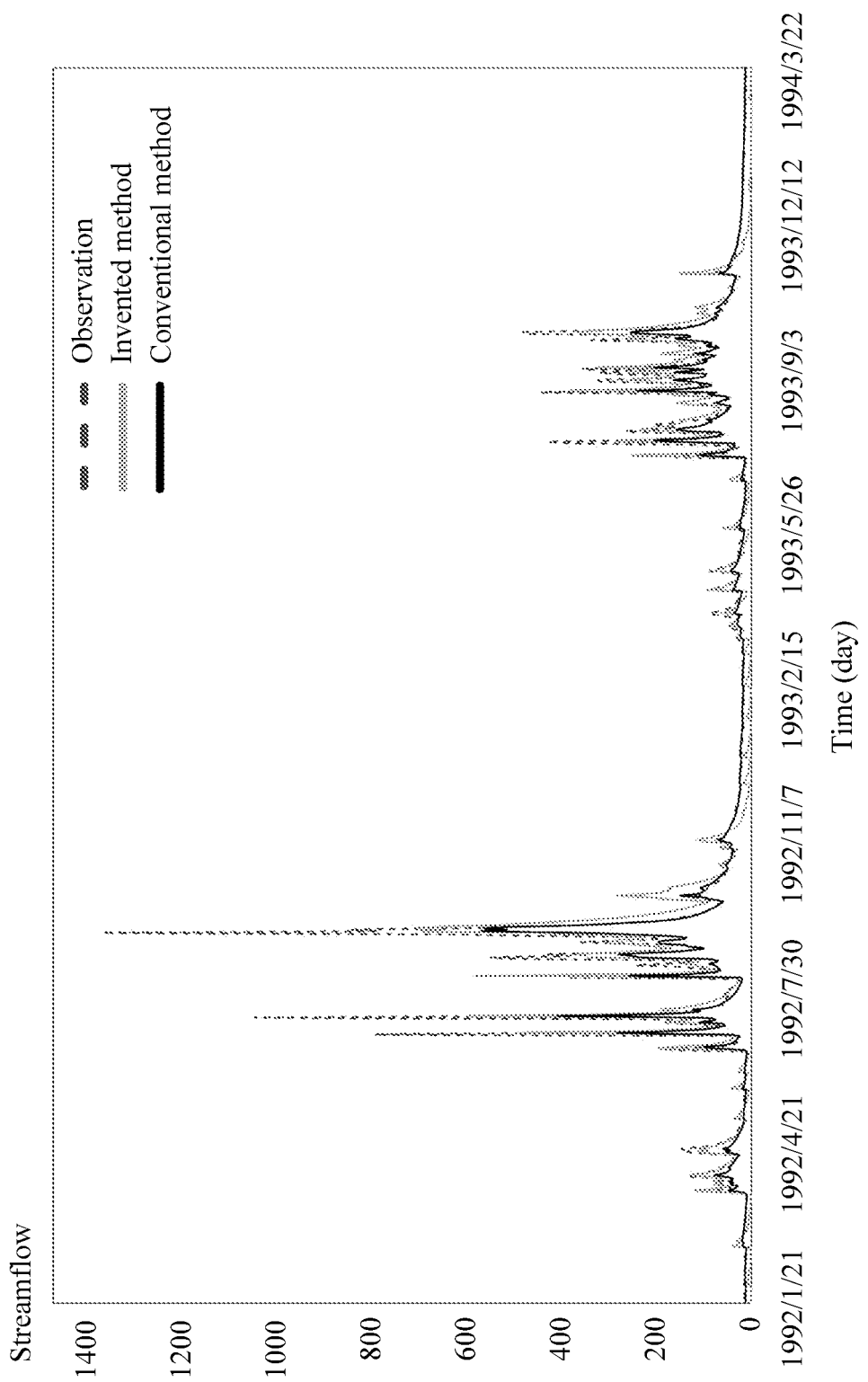
FIG. 3 is a schematic diagram of comparison between the observed results, the forecasting results of the invented method at 2-day lead time, and the forecasting results of the conventional method at 2-day lead time.
Figure 4:
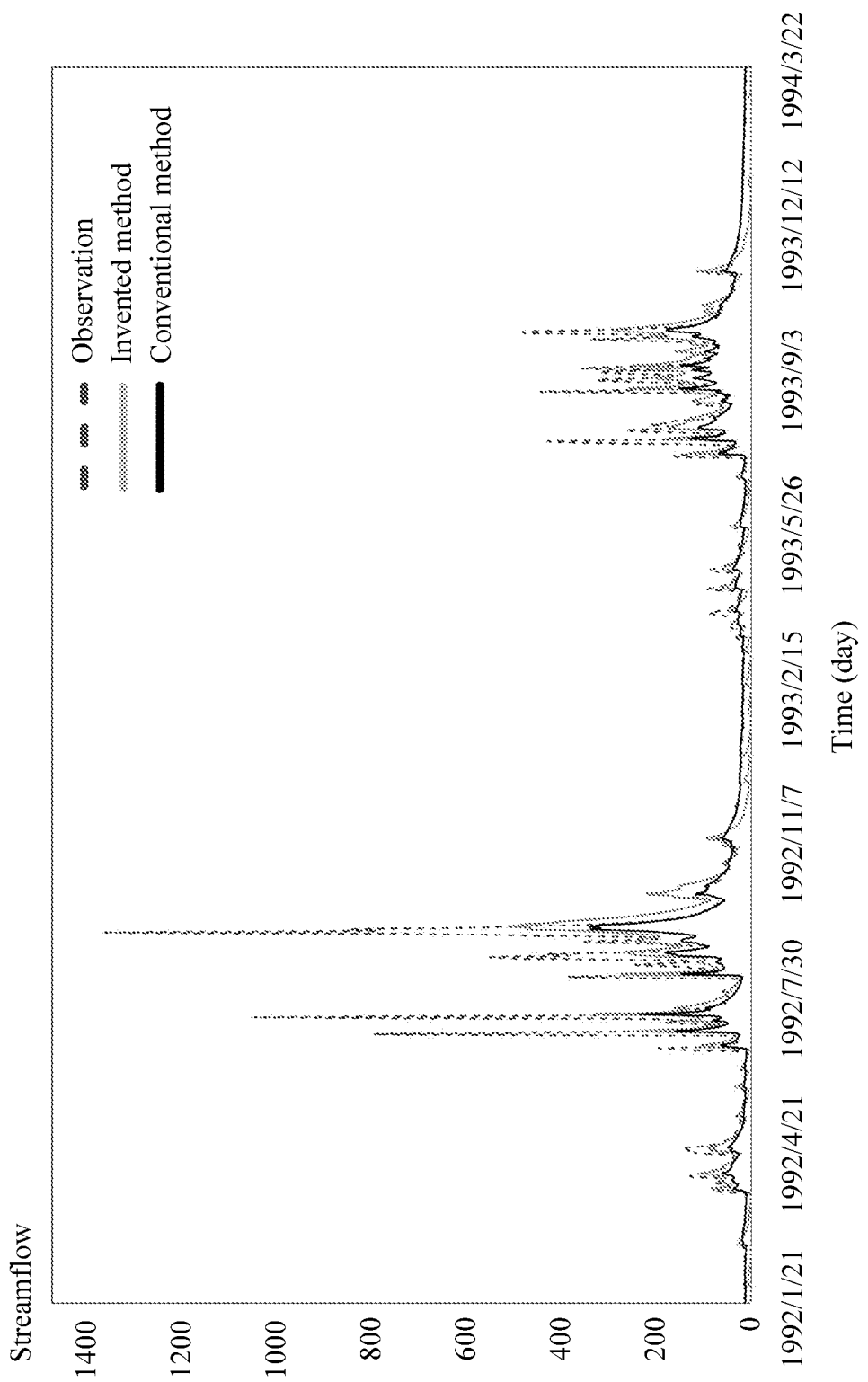
FIG. 4 is a schematic diagram of comparison between the observed results, the forecasting results of the invented method at 3-day lead time, and the forecasting results of the conventional method at 3-day lead time.

FIGS. 2-4 demonstrate the comparison between the observed streamflow, the forecasting streamflow of the invented method, the forecasting streamflow of the conventional method from 1992/1/12 to 1994/3/22. FIGS. 2-4 show that the forecasting performance of the invented method is better than that of the conventional method for 2-day and 3-day lead times, especially in terms of the simulation of peak flows. In addition, FIGS. 2-4 show that compared with the conventional method, the performance of the invented method decreases slower as the lead time increases, especially in terms of the simulation of peak flows.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for forecasting flood, the method comprising:
1) obtaining hydrological variables comprising precipitation and evaporation for a basin, wherein the precipitation is obtained by measuring rainfall data with radars, rain gauges, and precipitation micro-physical characteristics sensors (PMCSs) and by combining the rainfall data from the radars, the rain gauges, and the PMCSs;
2) collecting historical flood information for the basin to estimate a mean concentration time of the basin and to determine a maximum lead time k;
3) obtaining a series of observed streamflow $Q_t^{obs}$, wherein the observed streamflow $Q_t^{obs}$ represents the observed streamflow at a time t; t is an integer, and $1 \leq t \leq N$; and N is a total number of the observed streamflow;
4) establishing a hydrological model, and using the hydrological model for prediction by inputting the hydrological variables to the hydrological model to obtain a series of forecasted streamflow $Q_{t,t-j}^{pre}$; wherein the forecasted streamflow $Q_{t,t-j}^{pre}$ represents the forecasted streamflow at the time t at a lead time j; j is an integer, and $1 \leq j \leq k$; and the precipitation within lead times are neglected for the prediction;
5) calibrating parameters of the hydrological model with an objective function as follows to obtain the optimized hydrological model:

$$\min F = \sum_{t=1}^{N} \left( (Q_t^{obs} - Q_{t,t-1}^{pre})^2 + (Q_t^{obs} - Q_{t,t-2}^{pre})^2 + \ldots + (Q_t^{obs} - Q_{t,t-k}^{pre})^2 \right);$$

6) using the optimized hydrological model for prediction to obtain results for flood forecasts at multiple lead times, and sending the results for flood forecasts at the multiple lead times to manager computing devices for flood prevention by evaluating the forecasting performance of the optimized hydrological model using at least one criterion selected from: a Nash-Sutcliffe efficiency, a root mean square error, a water balance index, a qualified rate of peak flow, and a qualified rate of a peak time.

\* \* \* \* \*